(12) United States Patent
Amanuma (10) Patent No.: US 7,550,976 B2
(45) Date of Patent: Jun. 23, 2009

(54) APPARATUS/METHOD FOR MEASURING THE SWITCHING TIME OF OUTPUT SIGNALS OF A DUT

(75) Inventor: Seiji Amanuma, Tokyo (JP)

(73) Assignee: Advantest Corporation, Tokyo (JP)

( * ) Notice: Subject to any disclaimer, the term of this patent is extended or adjusted under 35 U.S.C. 154(b) by 64 days.

(21) Appl. No.: 11/710,237

(22) Filed: Feb. 23, 2007

(65) Prior Publication Data

US 2007/0210823 A1 Sep. 13, 2007

Related U.S. Application Data

(63) Continuation of application No. PCT/JP2007/052466, filed on Feb. 13, 2007.

(30) Foreign Application Priority Data

Feb. 17, 2006 (JP) .............................. 2006-041478

(51) Int. Cl.
*G01R 31/04* (2006.01)
*G01R 31/02* (2006.01)
*G01R 27/08* (2006.01)

(52) U.S. Cl. ..................... 324/537; 324/763; 324/713

(58) Field of Classification Search ................. None
See application file for complete search history.

(56) References Cited

U.S. PATENT DOCUMENTS 6,021,014 A * 2/2000 Seoung ..................... 360/64
6,141,092 A * 10/2000 Kim ........................ 356/214
6,762,608 B2 * 7/2004 Damon et al. ............. 324/550

(Continued)

FOREIGN PATENT DOCUMENTS

JP 06-201768 * 6/1994

(Continued)

OTHER PUBLICATIONS

International Search Report issued in International Application No. PCT/JP2007/052466 mailed on May 15, 2007, 3 pages.

*Primary Examiner*—Timothy J Dole
*Assistant Examiner*—Jeff Natalini
(74) *Attorney, Agent, or Firm*—Osha • Liang LLP (57) ABSTRACT

A measurement apparatus is provided for measuring at least one of the switching times of the output signals output from a device under test. The measurement apparatus comprises: a first light-emitting unit having a function whereby light emission starts in a case that the voltage of the output signal becomes equal to or greater than a first threshold voltage; a second light-emitting unit having a function whereby light emission starts in a case that the voltage of the output signal becomes equal to or greater than a second threshold voltage that is higher than the first threshold voltage; a first light reception unit which receives light emitted from the first light-emitting unit; a second light reception unit which receives light emitted from the second light-emitting unit; and a measurement unit which measures the switching time required for the voltage to switch between the first threshold voltage and the second threshold voltage, based upon at least one of the difference in the light-emission start timing and the difference in the light-emission stop timing between the first light-emitting unit and the second light-emitting unit.

11 Claims, 4 Drawing Sheets

U.S. PATENT DOCUMENTS

| | | | |
|---|---|---|---|
| 7,378,859 B2* | 5/2008 | Stellari et al. | 324/752 |
| 2004/0183559 A1* | 9/2004 | Ware et al. | 324/763 |
| 2005/0169324 A1* | 8/2005 | Ilday et al. | 372/18 |

FOREIGN PATENT DOCUMENTS

| | | |
|---|---|---|
| JP | 6-201768 | 7/1994 |
| JP | 7-229930 | 8/1995 |
| JP | 9-251038 | 9/1997 |
| JP | 2002-257872 | 9/2002 |

\* cited by examiner

APPARATUS/METHOD FOR MEASURING THE SWITCHING TIME OF OUTPUT SIGNALS OF A DUT

CROSS REFERENCE TO RELATED APPLICATION

This is a continuation application of PCT/JP2007/52466 filed on Feb. 13, 2007 which claims priority from a Japanese Patent Application(s) NO. 2006-041478 filed on Feb. 17, 2006, the contents of which are incorporated herein by reference.

BACKGROUND

1. Technical Field

The present invention relates to a measurement apparatus and a measurement method. Particularly, the present invention relates to a measurement apparatus and a measurement method for measuring the switching time of the output signal output from a device under test.

2. Related Art

For example, a high voltage resistant semiconductor device is known as a device used for controlling an electric automobile and a device used for controlling an AC fan motor, etc. Such a high voltage resistant semiconductor device has a structure in which the PN junction is partitioned with an insulating member such as $SiO_2$ or the like.

Let us consider a case in which a circuit that operates at high voltage is tested. In this case, an arrangement can be conceived in which a test apparatus acquires an output signal while remaining insulated from the circuit that operates at high voltage, thereby determining the quality of the output signal. However, such an arrangement in which an output signal is acquired while the test apparatus remains insulated from a circuit that operates at high voltage has a problem of a reduced response speed. This leads to a difficulty in measuring the rising time or the falling time of the output signal.

SUMMARY

Accordingly, with an aspect of the present invention, it is an object thereof to provide a measurement apparatus and a measurement method for solving the aforementioned problems. This object is achieved by combining the features described in the independent claims in the Claims. Also, the dependent claims lay forth further advantageous specific examples of the present invention.

In order to solve the aforementioned problems, a first aspect of the present invention provides a measurement apparatus for measuring at least one of the switching times of output signals output from a device under test, the measurement apparatus comprising: a first light-emitting unit having a function whereby, in a case that the voltage of the output signal becomes equal to or greater than a first threshold voltage, light is emitted; a second light-emitting unit having a function whereby, in a case that the voltage of the output signal becomes equal to or greater than a second threshold voltage that is higher than the first threshold voltage, light is emitted; a first light reception unit which receives light emitted from the first light-emitting unit; a second light reception unit which receives light emitted from the second light-emitting unit; a measurement unit which measures the switching time required for the voltage to switch between the first threshold voltage and the second threshold voltage, based upon at least one of the difference in the light-emission start timing and the difference in the light-emission stop timing between the first light-emitting unit and the second light-emitting unit.

Also, the measurement unit may measure the period of time from the point in time at which the first light-emitting unit starts to emit light up to the point in time at which the second light-emitting unit starts to emit light, thereby measuring the rising time required for the voltage to switch from the first threshold voltage to the second threshold voltage. Also, the measurement unit may measure the period of time from the point in time at which the second light-emitting unit stops to emit light up to the point in time at which the first light-emitting unit stops to emit light, thereby measuring the falling time required for the voltage to switch from the second threshold voltage to the first threshold voltage.

Also, the first light reception unit may include: a first laser output unit which is connected between the output terminal of the device under test and a base electric potential, and which has a function whereby, in a case that a current that is equal to or greater than a first threshold current flows through the first laser output unit, a laser light is output; and a first resistor which is connected between the output terminal of the device under test and the base electric potential in series with the first laser output unit, and which allows the first threshold current to flow through the first laser output unit in a case that the voltage of the output terminal becomes the first threshold voltage. Also, the second light reception unit may include: a second laser output unit which is connected between the output terminal of the device under test and the base electric potential, and which has a function whereby, in a case that a current that is equal to or greater than a second threshold current flows through the second laser output unit, a laser light is output; and a second resistor which is connected between the output terminal of the device under test and the base electric potential in series with the second laser output unit, and which allows the second threshold current to flow through the second laser output unit in a case that the voltage of the output terminal becomes the second threshold voltage.

Also, each of the first light reception unit and the second light reception unit may have a function whereby, in a case of reception of no light, a logic "L" signal is output, and a function whereby, in a case of reception of light, a logic "H" signal is output. Also, the measurement unit may comprise: an exclusive-OR gate which computes the exclusive-OR of the signal output from the first light reception unit and the signal output from the second light reception unit; and a logic-H measurement unit which measures the period during which the output of the exclusive-OR gate is maintained at the logic "H" signal, thereby measuring the switching time.

Also, the base electric potential of the device under test may be higher than the maximum values of the voltages output from the first light reception unit and the second light reception unit. Also, the measurement apparatus having a function as a test apparatus for measuring the device under test, may further comprises a determining unit having a function whereby, in a case that the switching time measured by the measurement unit is outside the range of standard values, determination is made that the device under test is defective.

A second aspect of the present invention relates to a measurement method for measuring at least one of the switching times of output signals output from a device under test. The measurement method comprises: a first light-emitting step in which, in a case that the voltage of the output signal becomes equal to or greater than a first threshold voltage, a first light-emitting unit emits light; a second light-emitting step in which, in a case that the voltage of the output signal becomes equal to or greater than a second threshold voltage that is higher than the first threshold voltage, a second light-emitting unit emits light; a first light receiving step for receiving light emitted from the first light-emitting unit; a second light receiving step for receiving light emitted from the second light-emitting unit; a measurement step for measuring the switching time required for the voltage to switch between the first threshold voltage and the second threshold voltage, based upon at least one of the difference in the light-emission start timing and the difference in the light-emission stop timing between the first light-emitting unit and the second light-emitting unit.

A third aspect of the present invention relates to a measurement apparatus for measuring the switching time of an output signal output from a device under test. The measurement apparatus comprises: a first light-emitting unit having a function whereby, in a case that the voltage of the output signal becomes equal to or greater than a first threshold voltage, there is a transition in the light-emission state of the first light-emitting unit; a second light-emitting unit having a function whereby, in a case that the voltage of the output signal becomes equal to or greater than a second threshold voltage that is higher than the first threshold voltage, there is a transition in the light-emission state of the second light-emitting unit; a first light reception unit which receives light emitted from the first light-emitting unit; a second light reception unit which receives light emitted from the second light-emitting unit; and a measurement unit which measures the switching time required for the voltage to switch between the first threshold voltage and the second threshold voltage, based upon the difference in the timing of the transition in the light-emission state between the first light-emitting unit and the second light-emitting unit.

A measurement apparatus according to a fourth embodiment of the present invention comprises a measurement unit which measures the period of time required for the switching time of the voltage of an output signal which is output from a device under test, based upon the difference in the timing of the transition in the state of light emission between the first light-emitting unit, which has a function whereby there is a transition in the state of light emission in a case that the voltage of the output signal output from the device under test becomes equal to or greater than a first threshold voltage, and the second light-emitting unit, which has a function whereby there is a transition in the state of light emission in a case that the voltage of the output signal becomes equal to or greater than a second threshold voltage that is higher than the first threshold voltage, wherein the according to the present invention transition in the state of light emission is detected by receiving light.

Note that the above overview of the invention is not a comprehensive listing of all essential features of the present invention, and that sub-combinations of these feature groups may also be encompassed by the invention.

DESCRIPTION OF EXEMPLARY EMBODIMENTS

The present invention will now be described by way of embodiments; however, it should be understood that the following embodiments do not restrict the invention according to the Claims, and that combinations of features described in the embodiments are not necessarily indispensable to the present invention.

Figure 1:
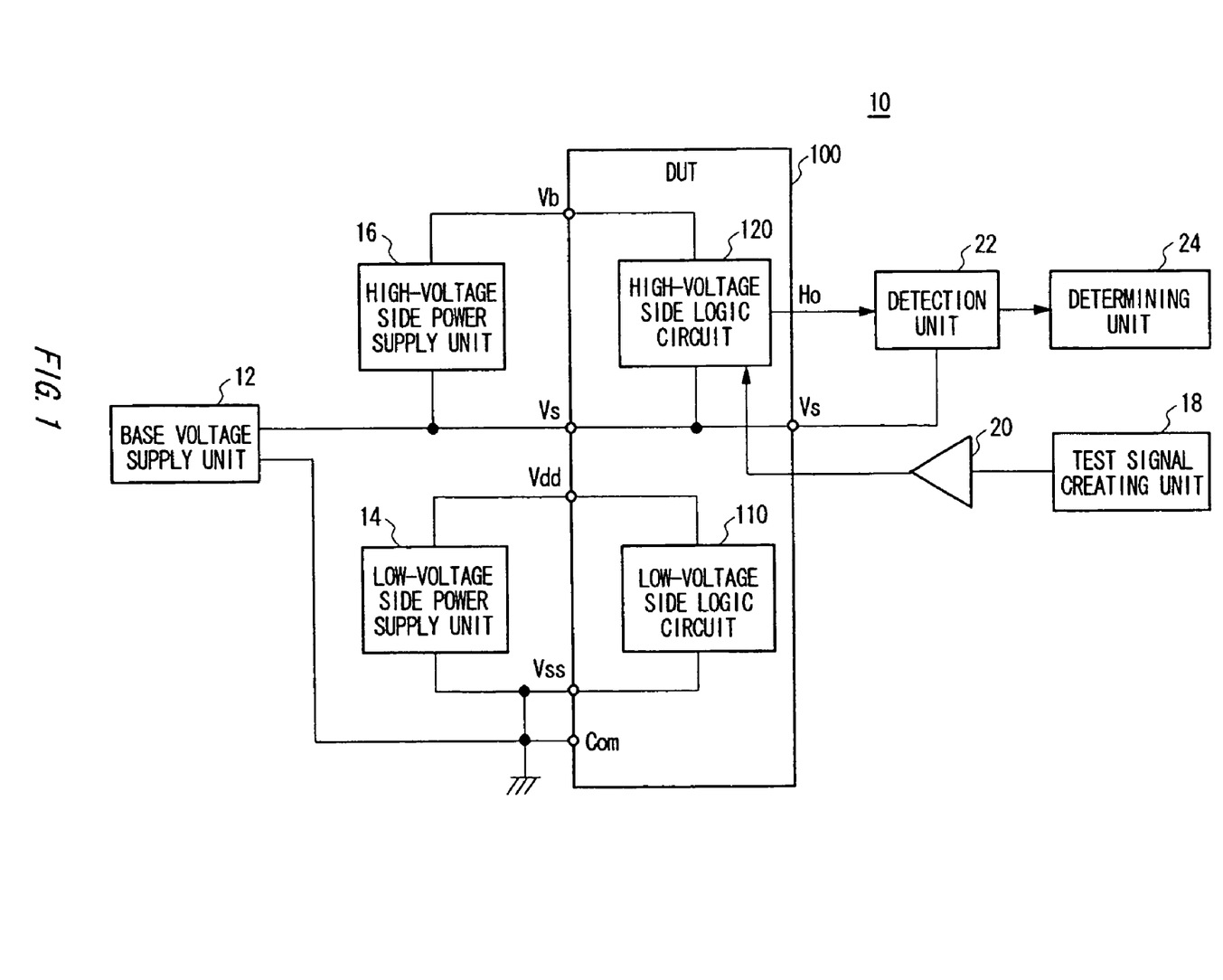
FIG. 1 shows a test apparatus 10 along with a DUT 100, according to the present embodiment.

FIG. 1 shows the configuration of a test apparatus 10 together with a device under test (which will be referred to as a "DUT 100" hereafter), according to the present embodiment.

As an example, the DUT 100 may include a low-voltage side logic circuit 110 and a high-voltage side logic circuit 120. The low-voltage side logic circuit 110 and the high-voltage side logic circuit 120 operate at respective base voltages that differ from one another. For example, the low-voltage side logic circuit 110 may operate at a base voltage of 0 V. On the other hand, the high-voltage side logic circuit 120 may operate at a base voltage of from several tens of volts to several thousand of volts.

Note that, with the present embodiment, the low-voltage side logic circuit 110 may operate at a base voltage relatively lower than that of the high-voltage side logic circuit 120, and equal to that of a circuit included in the test apparatus 10.

Furthermore, power supply voltages that differ from one another are applied to the low-voltage side logic circuit 110 and the high-voltage side logic circuit 120 that have respective base voltages that differ from one another. For example, a power supply voltage of from several volts to several tens of volts may be applied to the low-voltage side logic circuit 110 that has a base voltage of 0 V. On the other hand, a power supply voltage of from several volts to several tens of volts may be applied to the high-voltage side logic circuit 120 that has a base voltage of 1 KV, for example.

The test apparatus 10 is an example of a measurement apparatus according to the present invention, which provides functions as an apparatus for testing the DUT 100. More specifically, the test apparatus 10 measures at least one of the switching times of the output signals output from the DUT 100 so as to determine the quality of the DUT 100. The test apparatus 10 includes a base voltage supply unit 12, a low-voltage side power supply unit 14, a high-voltage side power supply unit 16, a test signal creating unit 18, a driving unit 20, a detection unit 22, and a determining unit 24.

The base voltage supply unit 12 supplies the base voltage to the DUT 100. As an example, the base voltage supply unit 12 may generate the base voltage between the positive-side terminal and the negative-side terminal. Let us consider an arrangement in which the DUT 100 includes the low-voltage side logic circuit 110 and the high-voltage side logic circuit 120. With such an arrangement, the negative side terminal of the base voltage supply unit 12 may be connected to the sink side power supply terminal Vss of the low-voltage side logic circuit 110 which is common to the ground terminal, for example. On the other hand, the positive-side terminal of the base voltage supply unit 12 may be connected to the sink side power supply terminal Vs of the high-voltage side logic circuit 120. With such an arrangement, the low-voltage side logic circuit 110 operates at a base voltage equal to the ground electric potential of the test apparatus 10. On the other hand, the high-voltage side logic circuit 120 operates at a base voltage equal to an electric potential that is higher than the ground electric potential of the test apparatus 10 by an amount that corresponds to the base voltage.

The low-voltage side power supply unit 14 generates the power supply voltage at the base electric potential of the low-voltage side logic circuit 110 as the base voltage in order to drive the low-voltage side logic circuit 110. Then, the low-voltage side power supply unit 14 supplies the power supply voltage thus generated to the low-voltage side logic circuit 110. As an example, let us consider an arrangement in which the negative side terminal of the base voltage supply unit 12 is connected to the sink side power supply terminal Vss of the low-voltage side logic circuit 110. With such an arrangement, the low-voltage side power supply unit 14 may generate a voltage of +15 V or the like using the base voltage of the sink side power supply terminal Vss as the base voltage thereof, for example. Furthermore, the power supply voltage thus generated may be applied to the source side power supply terminal Vdd of the low-voltage side logic circuit 110.

The high-voltage side power supply unit 16 generates the power supply voltage using the base electric potential of the high-voltage side logic circuit 120 as the base electric potential thereof in order to drive the high-voltage side logic circuit 120. Then, the low-voltage side power supply unit 14 supplies the power supply voltage thus generated to the high-voltage side logic circuit 120. As an example, let us consider an arrangement in which the positive side terminal of the base voltage supply unit 12 is connected to the sink side power supply terminal Vs of the high-voltage side logic circuit 120. With such an arrangement, the high-voltage side power supply unit 16 may generate a voltage of +15 V or the like using the voltage of the sink side power supply terminal Vs as the base voltage thereof, for example. Furthermore, the power supply voltage thus generated may be applied to the source side power supply terminal Vb of the high-voltage side logic circuit 112.

The test signal creating unit 18 outputs a test signal to the DUT 100. The driving unit 20 supplies the test signal thus output from the test signal creating unit 18 to the DUT 100. As an example, the driving unit 20 may supply the test signal to the high-voltage side logic circuit 120 such that the input and the output remain insulated from one another.

The detection unit 22 detects the switching time of the output signal output from the DUT 100. More specifically, the detection unit 22 detects at least one of the period of time (Tr) required for the output signal to rise from a first threshold voltage to a second threshold voltage that is higher than the first threshold voltage, and the period of time (Tf) required for the output signal to fall from the second threshold voltage to the first threshold voltage, thereby detecting the switching time. That is to say, the detection unit 22 detects the period of time required for the output signal to switch. As an example, the detection unit 22 detects the switching time of the output signal Ho output from the high-voltage side logic circuit 120 of the DUT 100 while remaining insulated from the high-voltage side logic circuit 120.

In a case that the switching time thus detected by the detection unit 22 is outside the range of standard values, the determining unit 24 determines that the DUT 100 is defective. The test apparatus 10 having such a configuration provides a function of measuring the switching time of the output signal output from the DUT 100. Furthermore, the test apparatus 10 provides a function of determining the quality of the DUT 100 based upon the switching time thus measured.

Figure 2:
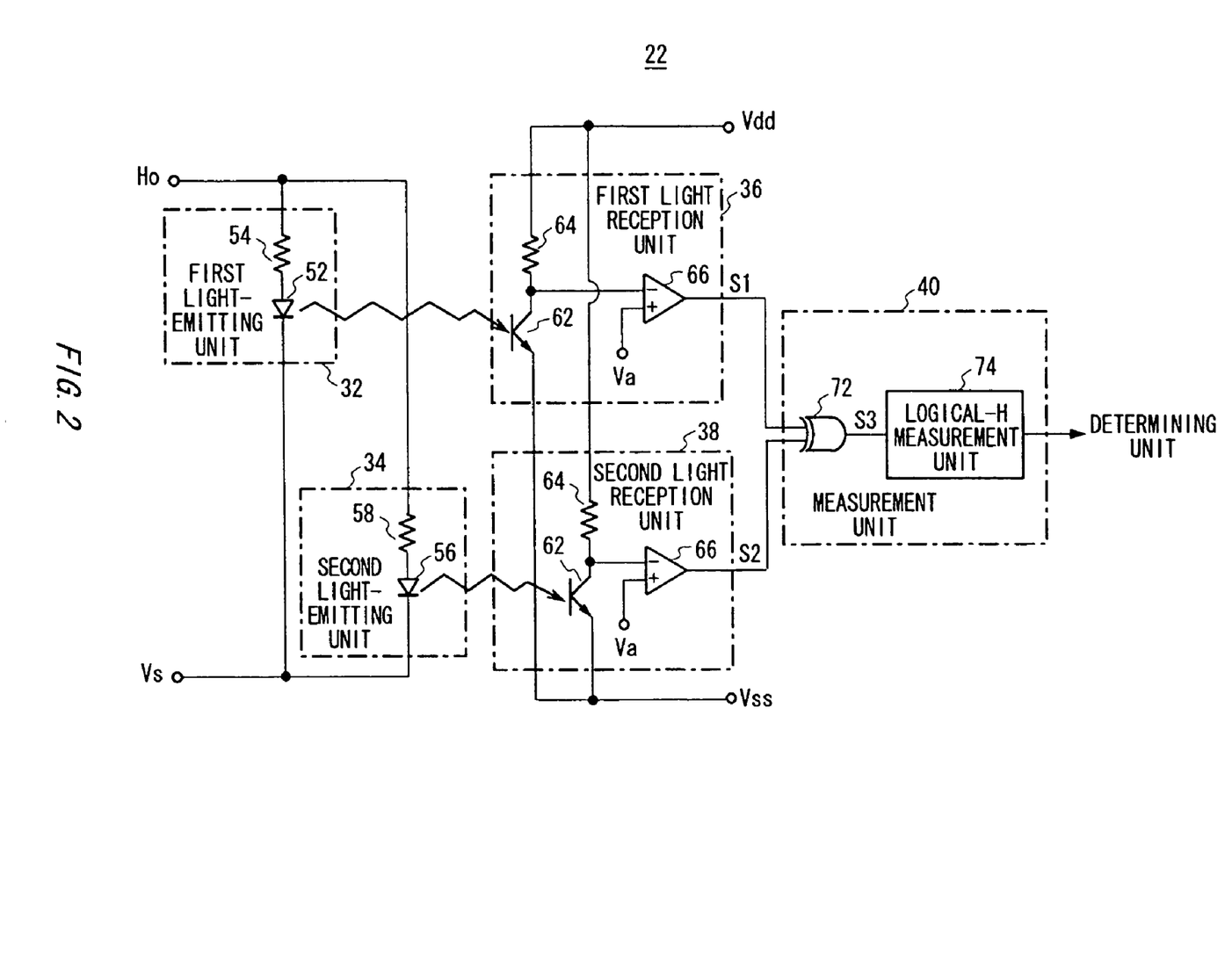
FIG. 2 shows a configuration of a detection unit 22 according to the present invention.

FIG. 2 shows a configuration of the detection unit 22 according to the present embodiment. The detection unit 22 includes a first light-emitting unit 32, a second light-emitting unit 34, a first light reception unit 36, a second light reception unit 38, and a measuring unit 40. In a case that the voltage of the output signal output from the DUT 100 becomes equal to or greater than the first threshold voltage, the first light-emitting unit 32 emits light. As an example, in a case that the voltage of the output voltage Ho output from the high-voltage side logic circuit 120 becomes equal to or greater than the first threshold voltage Vt1, the first light-emitting unit 32 may emit light.

As an example, the first light-emitting unit 32 may include a first laser output unit 52 and a first resistor 54. The first laser output unit 52 is connected between the output terminal of the DUT 100 and the base electric potential. As an example, the first laser output unit 52 may be a semiconductor laser. With such an arrangement, in a case that an electric current that flows through the first laser output unit 52 is equal to or greater than a first threshold electric current, the first laser output unit 52 outputs laser light. The first resistor 54 is connected between the output terminal of the DUT 100 and the base electric potential in series with the first laser output unit 52. The first resistor 54 has a resistance value that allows the first threshold current to flow through the first laser output unit 52 in a case that the voltage of the output terminal of the DUT 100 becomes the first threshold voltage.

With such an arrangement, the first laser output unit 52 and the first resistor 54 are connected in series. Accordingly, in a case that the output signal becomes equal to or greater than the first threshold voltage, an electric current equal to or greater than the first threshold current flows through the first laser output unit 52. Thus, in a case that the output signal becomes equal to or greater than the first threshold voltage, the first laser output unit 52 emits light. Note that, as an example, such a combination of the first laser output unit 52 and the first resistor 54 connected in series may be connected between the output terminal for the output signal Ho output from the high-voltage side logic circuit 120 and the sink side power supply terminal Vs, which provides the base electric potential of the high-voltage side logic circuit 120.

In a case that the voltage of the output signal becomes equal to or greater than the second threshold voltage, which is higher than the first threshold voltage, the second light-emitting unit 34 emits light. As an example, the second light-emitting unit 34 may include a second laser output unit 56 and a second resistor 58. The second laser output unit 56 is connected between the output terminal of the DUT 100 and the base electric potential. As an example, the second laser output unit 56 may be a semiconductor laser. With such an arrangement, in a case that an electric current that flows through the second laser output unit 56 is equal to or greater than a second threshold electric current, the second laser output unit 56 outputs laser light. The second resistor 58 is connected between the output terminal of the DUT 100 and the base electric potential in series with the second laser output unit 56. The second resistor 58 has a resistance value that allows the second threshold current to flow through the second laser output unit 56 in a case that the voltage of the output terminal of the DUT 100 becomes the second threshold voltage.

With such an arrangement, the second laser output unit 56 and the second resistor 58 are connected in series. Accordingly, in a case that the output signal becomes equal to or greater than the second threshold voltage, an electric current equal to or greater than the second threshold current flows through the second laser output unit 56. Thus, in a case that the output signal becomes equal to or greater than the second threshold voltage, the second laser output unit 56 emits light. Note that, as an example, such a combination of the second laser output unit 56 and the second resistor 58 connected in series may be connected between the output terminal for the output signal Ho output from the high-voltage side logic circuit 120 and the sink side power supply terminal Vs, which provides the base electric potential of the high-voltage side logic circuit 120.

The first light reception unit 36 receives the light output from the first light-emitting unit 32. The second light reception unit 38 receives the light output from the second light-emitting unit 34. Here, the first light reception unit 36 and the second light reception unit 38 may operate at base electric potentials that differ from the base electric potential of the DUT 100, while remaining electrically insulated from the first light-emitting unit 32 and the second light-emitting unit. Accordingly, the base electric potential of the DUT 100 from which output signals are output may be set to a value relatively higher than the maximum values of the voltages output from the first light reception unit 36 and the second light reception unit 38. With such an arrangement, the first light reception unit 36 and the second light reception unit 38 may receive light output from the first light-emitting unit 32 and the second light-emitting unit 34, each of which operates at the base electric potential (1 kV, for example) of the high-voltage side logic circuit 120, by means of circuits that operate at the base electric potential (0 V, for example) of the low-voltage side logic circuit 110.

Also, as an example, in a case of reception of no light from the first light-emitting unit 32 or the second light-emitting unit 34, the respective first light reception unit 36 or the second light reception unit 38 may output a logic "L" signal. On the other hand, in a case of reception of light from the first light-emitting unit 32 or the second light-emitting unit 34, the respective first light reception unit 36 or the second light reception unit 38 may output a logic "H" signal. With such an arrangement, as an example, each of the first light reception unit 36 and the second light reception unit 38 may include a phototransistor 62, a bias resistor 64, and a comparator 66.

With the phototransistor 62, the collector terminal is connected to the source side power supply terminal Vdd via the bias resistor 64. Furthermore, the emitter terminal is connected to the sink side power supply terminal Vss. In a case of reception of the light output from the first light-emitting unit 32 or the second light-emitting unit 34, the phototransistor 62 is turned on, thereby setting the collector terminal to the electric potential of the sink side power supply terminal Vss. On the other hand, in a case of reception of no light, the phototransistor 62 is turned off, thereby setting the collector terminal to the electric potential of the source side power supply terminal Vdd.

In a case that the collector terminal voltage of the phototransistor 62 becomes equal to or greater than the reference voltage Va, the comparator 66 outputs a logic "L" signal. On the other hand, in a case that the collector terminal voltage of the phototransistor 62 becomes smaller than the reference voltage Va, the comparator 66 outputs a logic "H" signal. The reference value Va is set to a desired value in a range between the electric potential of the source side power supply terminal Vdd and the electric potential of the sink side power supply terminal Vss. With such an arrangement, in a case of the phototransistor 62 receiving no light, the comparator 66 outputs the logic "L" signal. On the other hand, in a case of the phototransistor 62 receiving light, the comparator 66 outputs the logic "H" signal.

The measurement unit 40 measures the switching time required for the voltage to switch between the first threshold voltage and the second threshold voltage, based upon at least one of the difference in the light-emission start timing or the light-emission stop timing between the first light-emitting unit 32 and the second light-emitting unit 34. With such an arrangement, the second threshold voltage is greater than the first threshold voltage. Accordingly, at the rising time of the signal output from the DUT 100, first, the first light-emitting unit 32 starts to emit light, following which the second light-emitting unit 34 starts to emit light. Accordingly, the measurement unit 40 measures the period of time from the point in time at which the first light-emitting unit 32 starts to emit light up to the point in time at which the second light-emitting unit 34 starts to emit light, thereby measuring the rising time required for the voltage of the output signal to rise from the first threshold voltage to the second threshold voltage. On the other hand, at the falling time of the signal output from the DUT 100, first, the second light-emitting unit 34 stops to emit light, following which the first light-emitting unit 32 stops to emit light. Accordingly, the measurement unit 40 measures the period of time from the point in time at which the second light-emitting unit 34 stops to emit light up to the point in time at which the first light-emitting unit 32 stops to emit light, thereby measuring the falling time required for the voltage of the output signal to fall from the second threshold voltage to the first threshold voltage.

As an example, also, the measurement unit 40 may include an exclusive-OR gate 72 and a logic-H measurement unit 74. The exclusive-OR gate 72 computes the exclusive-OR of the signals output from the first light reception unit 36 and the second light reception unit 38. With such an arrangement, in a case of reception of no light, the first light reception unit 36 and the second light reception unit 38 output the logic "L" signals. On the other hand, in a case of reception of light, the first light reception unit 36 and the second light reception unit 38 output the logic "H" signals. Accordingly, the exclusive-OR gate 72 outputs the logic "H" signal during the period from the point in time at which the first light-emitting unit 32 starts to emit light up to the point in time at which the second light-emitting unit 34 starts to emit light, and the period from the point in time at which the first light-emitting unit 32 stops to emit light up to the point in time at which the second light-emitting unit 34 stops to emit light. The logic-H measurement unit 74 measures the period of time during which the exclusive-OR gate 72 outputs the logic "H" signal, thereby measuring the switching time. As described above, the measurement unit 40 includes the exclusive-OR gate 72 and the logic-H measurement unit 74. Such an arrangement provides a function of measuring the difference in the light-emission start timing and the difference in the light-emission stop timing between the first light-emitting unit 32 and the second light-emitting unit 34.

Instead of the aforementioned arrangement, the first light-emitting unit 32 may have a function whereby light is emitted in a case that the voltage of the output signal is smaller than the first threshold voltage, and a function whereby light emission is stopped in a case that the voltage of the output signal is equal to or greater than the first threshold voltage. In the same way, the second light-emitting unit 34 may have a function whereby light is emitted in a case that the voltage of the output signal is smaller than the second threshold voltage, and a function whereby light emission is stopped in a case that the voltage of the output signal is equal to or greater than the first threshold voltage. With such an arrangement, the measurement unit 40 may measure the period of time from the point in time at which the first light-emitting unit 32 stops to emit light up to the point in time at which the second light-emitting unit 34 stops to emit light, thereby measuring the rising time required for the voltage of the output signal to rise from the first threshold voltage to the second threshold voltage. Also, the measurement unit 40 may measure the period of time from the point in time at which the first light-emitting unit 32 starts to emit light to the point in time at which the second light-emitting unit 34 starts to emit light, thereby measuring the falling time required for the voltage of the output signal to fall from the first threshold voltage to the second threshold voltage.

Also, yet another arrangement may be made in which a micro current is applied to the first light-emitting unit 32, and accordingly, the first light-emitting unit 32 always emits light. With such an arrangement, in a case that the output voltage becomes greater than the first threshold value, the amount of light emission output from the first light-emitting unit 32 may greatly change. In the same way, a micro current may be applied to the second light-emitting unit 34, and accordingly, the second light-emitting unit 34 may always emit light. With such an arrangement, in a case that the output voltage becomes greater than the second threshold value, the amount of light emission output from the second light-emitting unit 34 may greatly change. With such an arrangement, the first laser output unit 52, which is included in the first light-emitting unit 32, and the second laser output unit 56, which is included in the second light-emitting unit 34, are set beforehand to a state in which a minute amount of light is emitted. Such an arrangement enables the amount of light emission to be increased in a short period of time, compared to the period of time that is required to start laser oscillation from the state in which the emission of light has completely stopped.

With such an arrangement, the measurement unit 40 may measure the period of time from the point in time at which there is a great change in the amount of light emission output from the first light-emitting unit 32 up to the point in time at which there is a great change in the amount of light emission output from the second light-emitting unit 34, thereby measuring the rising time from the first threshold voltage to the second threshold voltage, or the falling time from the second threshold voltage to the first threshold voltage. That is to say, the measurement unit 40 may measure the period of time from the time of transition in the light-emission state of the first light-emitting unit 32 up to the time of transition in the light-emission state of the second light-emitting unit 34, thereby measuring the rising time or the falling time of the output signal.

Figure 3:
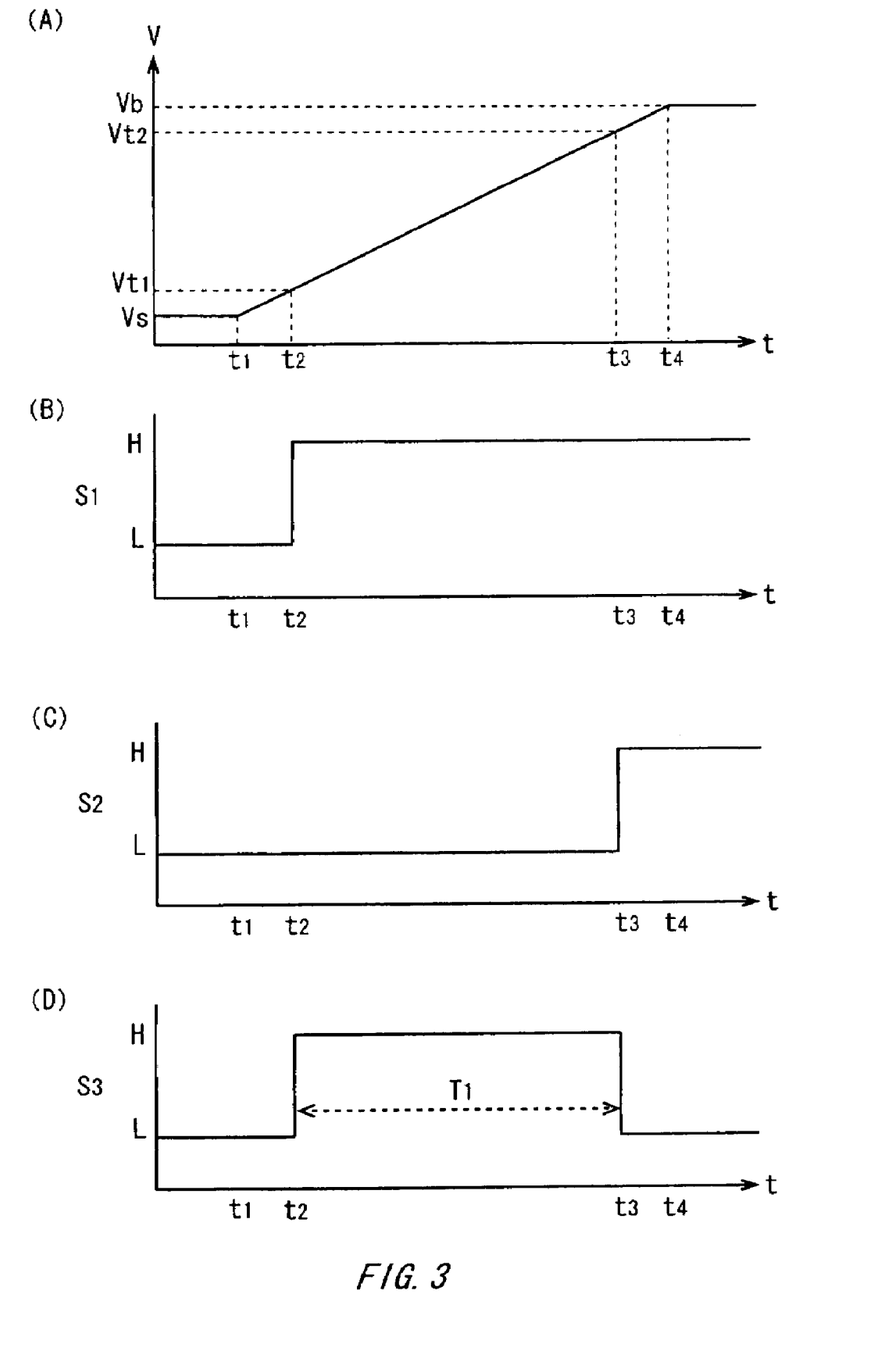
FIG. 3 shows, at the rising time, an example of: a signal waveform of an output signal Ho output from a high-voltage side logic circuit 120 of the DUT 100; a signal output from a first light reception unit 36, and a signal output from a second light reception unit 38; and a signal output from a measurement unit 40.

FIG. 3 shows, at the rising time and according to the present embodiment, an example of: a signal waveform of the output signal Ho output from the high-voltage side logic circuit 120 of the DUT 100; a signal output from the first light reception unit 36, and a signal output from the second light reception unit 38; and a signal output from the measurement unit 40.

FIG. 3(A) shows a waveform of the output signal Ho output from the high-voltage side logic circuit 120 at the rising time. The high-voltage side logic circuit 120 sets the output signal Ho to the terminal voltage Vs of the sink side power supply terminal before the point in time t1. The high-voltage side logic circuit 120 starts to increase the output signal Ho at the point in time t1. Subsequently, the output signal Ho reaches the first threshold voltage Vt1 at the point in time t2. Then, the output signal Ho reaches the second threshold voltage Vt2 at the point in time t3. Subsequently, the high-voltage side logic circuit 120 sets the output signal Ho to the terminal voltage Vb of the source side power supply terminal at the point in time t4, whereupon the increase of the output signal Ho is stopped. The high-voltage side logic circuit 120 maintains the output signal Ho at the terminal voltage Vb of the source side power supply terminal after the point in time t4.

FIG. 3(B) shows a signal output from the first light reception unit 36. In a case that the output signal Ho as shown in FIG. 3(A) has been output from the high-voltage side logic circuit 120, the first light-emitting unit 32 emits light from the point in time t2 at which the output signal Ho reaches the threshold voltage Vt1. With such an arrangement, the first light reception unit 36 receives the light output from the first light-emitting unit 32. Accordingly, the first light reception unit 36 outputs the logic "L" signal before the point in time t2, and outputs the logic "H" signal after the point in time t2.

FIG. 3(C) shows a signal output from the second light reception unit 38. In a case that the output signal Ho as shown in FIG. 3(A) has been output from the high-voltage side logic circuit 120, the second light-emitting unit 34 emits light from the point in time t3 at which the output signal Ho reaches the threshold voltage Vt2. With such an arrangement, the second light reception unit 38 receives the light output from the second light-emitting unit 34. Accordingly, the second light reception unit 38 outputs the logic "L" signal before the point in time t3, and outputs the logic "H" signal after the point in time t3.

FIG. 3(D) shows a signal output from the measurement unit 40. The measurement unit 40 measures the period of time required for the output signal Ho to change from the first threshold voltage Vt1 to the second threshold voltage Vt2 based upon the difference in time from the time at which light emission by the first light-emitting unit 32 starts to the time at which light emission by the second light-emitting unit 34 starts. As an example, the measurement unit 40, using the exclusive-OR gate 72, detects a period of time T1 during which the first light reception unit 36 outputs the logic "H" signal, and the second light reception unit 38 outputs the logic "L" signal, thereby measuring the period of time T1.

As described above, the first light-emitting unit 32 starts to emit light at the point in time at which the output signal Ho exhibits relatively low voltage (first threshold voltage Vt1). On the other hand, the second light-emitting unit 34 starts to emit light at the point in time at which the output signal Ho exhibits relatively high voltage (second threshold voltage Vt2). Accordingly, at the rising time of the output signal Ho, first, the first light-emitting unit 32 starts to emit light. Subsequently, the second light-emitting unit 34 starts to emit light. With such an arrangement, the detection unit 22 detects the difference in the time at which light emission starts between the first light-emitting unit 32 and the second light emitting unit 34. Such an arrangement provides a function of measuring the period of time required for the output signal Ho to switch from the first threshold voltage Vt1 to the second threshold voltage Vt2.

Figure 4:
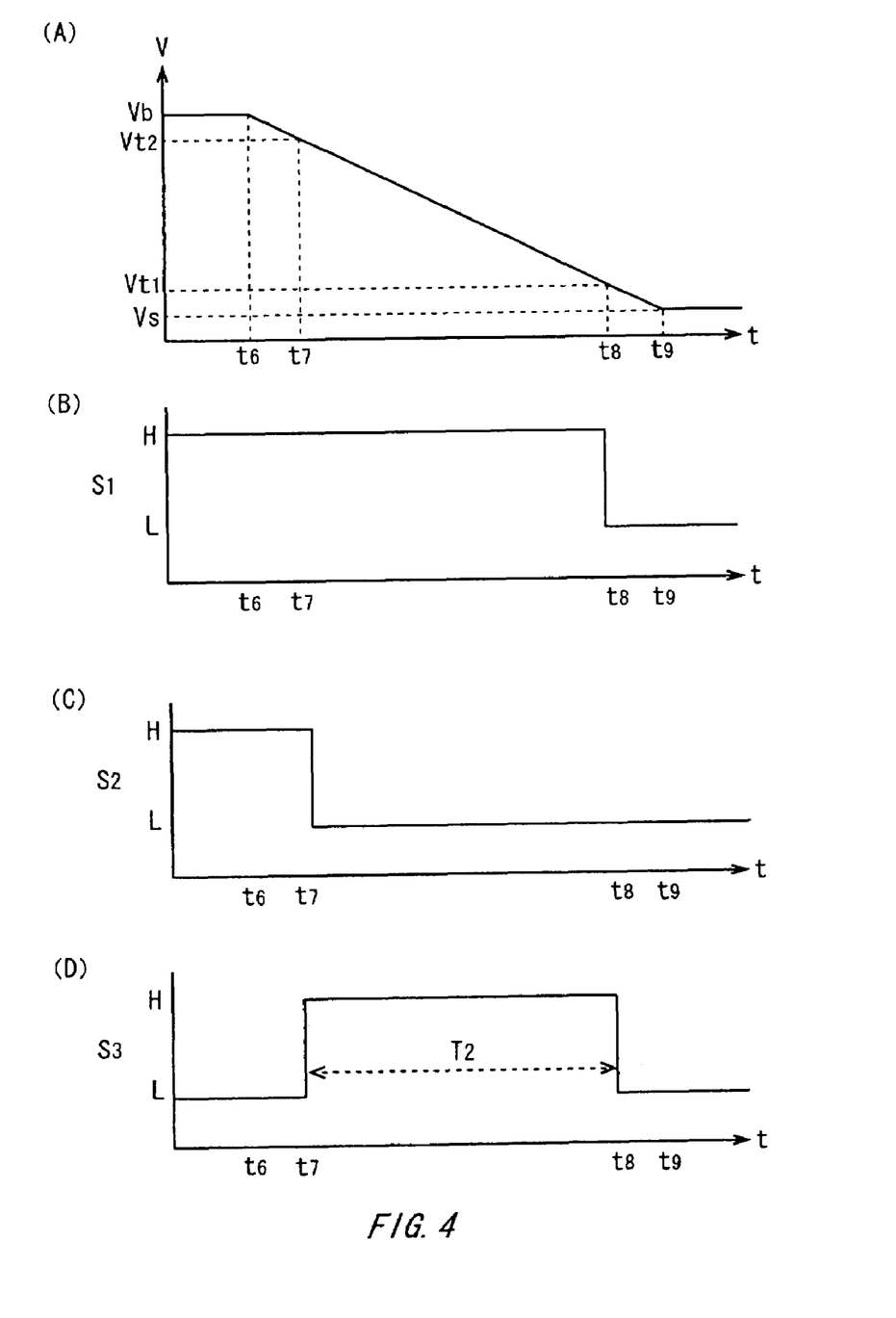
FIG. 4 shows, at the falling time, an example of: a signal waveform of the output signal Ho output from the high-voltage side logic circuit 120 of the DUT 100; a signal output from the first light reception unit 36; a signal output from the second light reception unit 38; and a signal output from the measurement unit 40.

FIG. 4 shows, at the falling time and according to the present embodiment, an example of: a signal waveform of the output signal Ho output from the high-voltage side logic circuit 120 of the DUT 100; a signal output from the first light reception unit 36; a signal output from the second light reception unit 38; and a signal output from the measurement unit 40.

FIG. 4(A) shows a waveform of the output signal Ho output from the high-voltage side logic circuit 120 at the falling time. The high-voltage side logic circuit 120 sets the output signal Ho to the terminal voltage Vb of the source side power supply terminal before the point in time t6. The high-voltage side logic circuit 120 starts to reduce the output signal Ho at the point in time t6. Subsequently, the output signal Ho reaches the second threshold voltage Vt2 at the point in time t7. Then, the output signal Ho reaches the first threshold voltage Vt1 at the point in time t8. Subsequently, the high-voltage side logic circuit 120 sets the output signal Ho to the terminal voltage Vs of the sink side power supply terminal at the point in time t9, whereupon the reduction of the output signal Ho is stopped. The high-voltage side logic circuit 120 maintains the output signal Ho at the terminal voltage Vs of the sink side power supply terminal after the point in time t9.

FIG. 4(B) shows a signal output from the first light reception unit 36. In a case that the output signal Ho as shown in FIG. 4(A) has been output from the high-voltage side logic circuit 120, the first light-emitting unit 32 stops to emit light at the point in time t8 at which the output signal Ho reaches the threshold voltage Vt1. With such an arrangement, the first light reception unit 36 receives the light output from the first light-emitting unit 32. Accordingly, the first light reception unit 36 outputs the logic "H" signal before the point in time t8, and outputs the logic "L" signal after the point in time t8.

FIG. 4(C) shows a signal output from the second light reception unit 38. In a case that the output signal Ho as shown in FIG. 4(A) has been output from the high-voltage side logic circuit 120, the second light-emitting unit 34 stops to emit light at the point in time t7 at which the output signal Ho reaches the threshold voltage Vt2. With such an arrangement, the second light reception unit 38 receives the light output from the second light-emitting unit 34. Accordingly, the second light reception unit 38 outputs the logic "H" signal before the point in time t7, and outputs the logic "L" signal after the point in time t7.

FIG. 4(D) shows a signal output from the measurement unit 40. The measurement unit 40 measures the period of time required for the output signal Ho to change from the second threshold voltage Vt2 to the first threshold voltage Vt1 based upon the difference in time from the time at which the second light-emitting unit 34 stops to emit light to the time at which the first light-emitting unit 32 stops to emit light. As an example, the measurement unit 40, using the exclusive-OR gate 72, detects a period of time T2 during which the first light reception unit 36 outputs the logic "H" signal, and the second light reception unit 38 outputs the logic "L" signal, thereby measuring the period of time T2.

As described above, the second light-emitting unit 34 stops to emit light at the point in time at which the output signal Ho exhibits relatively high voltage (second threshold voltage Vt2). On the other hand, the first light-emitting unit 32 stops to emit light at the point in time at which the output signal Ho exhibits relatively low voltage (first threshold voltage Vt1). Accordingly, at the falling time of the output signal Ho, first, the second light-emitting unit 34 stops to emit light. Subsequently, the first light-emitting unit 32 stops to emit light. With such an arrangement, the detection unit 22 detects the difference in the time at which light emission stops between the second light-emitting unit 34 and the first light emitting unit 32. Such an arrangement provides a function of measuring the period of time required for the output signal Ho to switch from the second threshold voltage Vt2 to the first threshold voltage Vt1.

While the present invention has been described thus by way of embodiments, the technical scope of the present invention is not restricted to the scope of the embodiments described above. Various modifications and improvements may be made to the above-described embodiments. It is to be clearly understood from the Claims that such modifications and improvements are also encompassed within the technical scope of the present invention.

As can be clearly understood from the aforementioned description, the embodiment according to the present invention provides a measurement apparatus and a measurement method for measuring with high precision the switching time of the output signal of a device under test while remaining insulated from the device under test.

What is claimed is:

1. A measurement apparatus for measuring at least one of the switching times of output signals output from a device under test of high voltage resistant type, the switching times representing the quality of the device under test, said measurement apparatus comprising:

a first light-emitting unit having a function whereby, in a case that the voltage of the output signal becomes equal to or greater than a first threshold voltage, light is emitted;

a second light-emitting unit having a function whereby, in a case that the voltage of the output signal becomes equal to or greater than a second threshold voltage that is higher than the first threshold voltage, light is emitted;

a first light reception unit which receives light emitted from said first light-emitting unit;

a second light reception unit which receives light emitted from said second light-emitting unit; and a measurement unit which measures the switching time required for the voltage to switch between the first threshold voltage and the second threshold voltage, based upon at least one of the difference in the light-emission start timing and the difference in the light-emission stop timing between said first light-emitting unit and said second light-emitting unit, wherein the first light-emitting unit and the second light-emitting unit are electrically coupled to an output terminal of the device under test.

2. The measurement apparatus according to claim 1, wherein said measurement unit measures the period of time from the point in time at which said first light-emitting unit starts to emit light up to the point in time at which said second light-emitting unit starts to emit light, thereby measuring the rising time required for the voltage to switch from the first threshold voltage to the second threshold voltage.

3. The measurement apparatus according to claim 1, wherein said measurement unit measures the period of time from the point in time at which said second light-emitting unit stops to emit light up to the point in time at which said first light-emitting unit stops to emit light, thereby measuring the falling time required for the voltage to switch from the second threshold voltage to the first threshold voltage.

4. The measurement apparatus according to claim 1, wherein said first light reception unit comprises:

a first laser output unit which is connected between the output terminal of the device under test and a base electric potential, and which has a function whereby, in a case that a current that is equal to or greater than a first threshold current flows through said first laser output unit, a laser light is output; and a first resistor which is connected between the output terminal of the device under test and the base electric potential in series with said first laser output unit, and which allows the first threshold current to flow through said first laser output unit in a case that the voltage of the output terminal becomes the first threshold voltage, and wherein said second light reception unit comprises:

a second laser output unit which is connected between the output terminal of the device under test and the base electric potential, and which has a function whereby, in a case that a current that is equal to or greater than a second threshold current flows through said second laser output unit, a laser light is output; and a second resistor which is connected between the output terminal of the device under test and the base electric potential in series with said second laser output unit, and which allows the second threshold current to flow through said second laser output unit in a case that the voltage of the output terminal becomes the second threshold voltage.

5. The measurement apparatus according to claim 1,
wherein each of said first light reception unit and said second light reception unit has a function whereby, in a case of reception of no light, a logic "L" signal is output, and a function whereby, in a case of reception of light, a logic "H" signal is output, and wherein said measurement unit comprises:

an exclusive-OR gate which computes the exclusive-OR of the signal output from said first light reception unit and the signal output from said second light reception unit; and a logic-H measurement unit which measures the period during which the output of said exclusive-OR gate is maintained at the logic "H" signal, thereby measuring the switching time.

6. The measurement apparatus according to claim 1, wherein the base electric potential of the device under test is higher than the maximum values of the voltages output from said first light reception unit and said second light reception unit.

7. The measurement apparatus according to claim 1, having a function as a test apparatus for measuring the device under test, said measurement apparatus further comprising a determining unit having a function whereby, in a case that the switching time measured by said measurement unit is outside the range of standard values, determination is made that the device under test is defective.

8. A measurement method for measuring at least one of the switching times of output signals output from a device under test of high voltage resistant type, the switching times representing the quality of the device under test, said measurement method comprising:

receiving an electrical signal output from the device under test;

emitting light by a first light-emitting unit when the voltage of the output signal becomes equal to or greater than a first threshold voltage;

emitting light by a second light-emitting unit when the voltage of the output signal becomes equal to or greater than a second threshold voltage that is higher than the first threshold voltage;

receiving light emitted from said first light-emitting unit;

receiving light emitted from said second light-emitting unit; and measuring the switching time required for the voltage to switch between the first threshold voltage and the second threshold voltage, based upon at least one of the difference in the light-emission start timing and the difference in the light-emission stop timing between said first light-emitting unit and said second light-emitting unit.

9. A measurement apparatus for measuring the switching time of an output signal output from a device under test of high voltage resistant type, the switching time representing the quality of the device under test, said measurement apparatus comprising:

a first light-emitting unit having a function whereby, in a case that the voltage of the output signal becomes equal to or greater than a first threshold voltage, there is a transition in the light-emission state of said first light-emitting unit;

a second light-emitting unit having a function whereby, in a case that the voltage of the output signal becomes equal to or greater than a second threshold voltage that is higher than the first threshold voltage, there is a transition in the light-emission state of said second light-emitting unit;

a first light reception unit which receives light emitted from said first light-emitting unit;

a second light reception unit which receives light emitted from said second light-emitting unit; and a measurement unit which measures the switching time required for the voltage to switch between the first threshold voltage and the second threshold voltage, based upon the difference in the timing of the transition in the light-emission state between said first light-emitting unit and said second light-emitting unit, wherein the first light-emitting unit and the second light-emitting unit are electrically coupled to an output terminal of the device under test.

10. A measurement apparatus comprising:

a measurement unit which measures the period of time required for the switching time of the voltage of an output signal which is output from a device under test of high voltage resistant type, the switching time representing the quality of the device under test, based upon the difference in the timing of the transition in the state of light emission between a first light-emitting unit, which has a function whereby there is a transition in the state of light emission in a case that the voltage of the output signal output from the device under test becomes equal to or greater than a first threshold voltage, and a second light-emitting unit, which has a function whereby there is a transition in the state of light emission in a case that the voltage of the output signal becomes equal to or greater than a second threshold voltage that is higher than said first threshold voltage, wherein the transition in the state of light emission is detected by receiving light, and wherein the first light-emitting unit and the second light-emitting unit are electrically coupled to an output terminal of the device under test.

11. The measurement apparatus according to claim 10,
wherein the light-emission state represents a state in which light is being emitted, or a state in which the emission of light has stopped, wherein said measurement unit measures the period of time required for the switching time of the voltage of the output signal, based upon the difference in the timing at which light emission staffs or stops between said first light-emitting unit, which has a function whereby the light emission starts or stops in a case that the voltage of the output signal becomes equal to or greater than the first threshold voltage, and said second light-emitting unit, which has a function whereby the light emission starts or stops in a case that the voltage of the output signal becomes equal to or greater than the second threshold voltage, and wherein the light-emission start timing or the light-emission stop timing is detected by receiving light.

* * * * *

UNITED STATES PATENT AND TRADEMARK OFFICE
CERTIFICATE OF CORRECTION

PATENT NO. : 7,550,976 B2  
APPLICATION NO. : 11/710237  
DATED : June 23, 2009  
INVENTOR(S) : Seiji Amanuma Page 1 of 1

It is certified that error appears in the above-identified patent and that said Letters Patent is hereby corrected as shown below:

In Claim 1, column 12, line 12, the word "ease" should read --case--.

In Claim 1, column 12, line 16, the word "ease" should read --case--.

In Claim 4, column 12, line 67, the word "ease" should read --case--.

In Claim 11, column 14, line 54, the word "staffs" should read --sta_rt_s--.

Signed and Sealed this

Eighteenth Day of August, 2009

David J. Kappos  
*Director of the United States Patent and Trademark Office*